(12) United States Patent
Yamagata et al.

(10) Patent No.: US 9,446,901 B2
(45) Date of Patent: Sep. 20, 2016

(54) STORAGE DEVICE

(71) Applicant: YAMAHA HATSUDOKI KABUSHIKI KAISHA, Shizuoka-ken (JP)

(72) Inventors: Hirotoshi Yamagata, Shizuoka (JP); Akira Kishida, Shizuoka (JP); Atsushi Okada, Shizuoka (JP); Toshimichi Satou, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 541 days.

(21) Appl. No.: 13/893,042

(22) Filed: May 13, 2013

(65) Prior Publication Data
US 2013/0309051 A1   Nov. 21, 2013

(30) Foreign Application Priority Data

May 17, 2012   (JP) .................................. 2012-113460

(51) Int. Cl.
| | |
|---|---|
| *B65G 33/06* | (2006.01) |
| *B65G 1/12* | (2006.01) |
| *B65G 25/02* | (2006.01) |
| *B65G 47/51* | (2006.01) |
| *B65G 57/112* | (2006.01) |
| *B65G 57/30* | (2006.01) |
| *B65G 59/06* | (2006.01) |

(Continued)

(52) U.S. Cl.
CPC . *B65G 1/12* (2013.01); *B65G 1/04* (2013.01); *B65G 25/02* (2013.01); *B65G 47/514* (2013.01); *B65G 47/5181* (2013.01); *B65G 57/112* (2013.01); *B65G 57/303* (2013.01); *B65G 57/307* (2013.01); *B65G 59/067* (2013.01); *H05K 13/0061* (2013.01); *H05K 13/021* (2013.01); *H05K 13/0434* (2013.01)

(58) Field of Classification Search
CPC .................................. B65G 33/06; G65H 3/28
See application file for complete search history.

(56) References Cited

U.S. PATENT DOCUMENTS

| | | | |
|---|---|---|---|
| 4,573,676 A | | 3/1986 | Miyamoto et al. |
| 4,950,120 A | * | 8/1990 | Barnes .................. B65G 33/06 |
| | | | 221/222 |

(Continued)

FOREIGN PATENT DOCUMENTS

| | | |
|---|---|---|
| CA | 2808933 A1 | 3/2012 |
| CN | 1756475 A | 4/2006 |

(Continued)

OTHER PUBLICATIONS

An Office Action issued by the Korean Patent Office on Apr. 26, 2015, which corresponds to Korean Patent Application No. 10-2013-0054737 and is related to U.S. Appl. No. 13/893,042; with English language summary.

(Continued)

*Primary Examiner* — Jonathan Snelting
(74) *Attorney, Agent, or Firm* — Studebaker & Brackett PC

(57) ABSTRACT

A storage device includes: a storage member having, in the vertical direction, a plurality of parallel storage sections that are capable of storing plate-like members; and a first lifting and lowering mechanism that causes the plate-like members, stored in the storage member, to move integrally in the vertical direction, while the position of the storage member in the vertical direction is maintained.

10 Claims, 11 Drawing Sheets

(51) Int. Cl.
*B65G 1/04* (2006.01)
*H05K 13/00* (2006.01)
*H05K 13/02* (2006.01)
*H05K 13/04* (2006.01)

(56) References Cited

U.S. PATENT DOCUMENTS

| | | | |
|---|---|---|---|
| 5,645,392 A | 7/1997 | Leichty et al. | |
| 5,816,798 A | 10/1998 | Strohmaier | |
| 6,098,379 A * | 8/2000 | Spatafora | B65B 35/04 414/788.9 |
| 2004/0101386 A1 | 5/2004 | Robey | |
| 2010/0256801 A1 | 10/2010 | Ohno | |
| 2013/0223961 A1 | 8/2013 | Hanel | |

FOREIGN PATENT DOCUMENTS

| | | |
|---|---|---|
| CN | 101808499 A | 8/2010 |
| CN | 101861090 A | 10/2010 |
| DE | 9111388 U1 | 11/1991 |
| EP | 0688730 A1 | 12/1995 |
| GB | 2468667 A | 9/2010 |
| JP | S60-183740 U | 12/1985 |
| JP | H05-32315 A | 2/1993 |
| JP | H06-321317 A | 11/1994 |
| JP | 3236464 B2 | 12/2001 |
| JP | 2007-137459 A | 6/2007 |
| JP | 2009-147197 A | 7/2009 |

OTHER PUBLICATIONS

The partial European search report issued on Aug. 29, 2013, which corresponds to EP13002580.2-1707 and is related to U.S. Appl. No. 13/893,042.

An Office Action issued by the Korean Patent Office on Oct. 28, 2014, which corresponds to Korean Patent Application No. 10-2013-0054737 and is related to U.S. Appl. No. 13/893,042; with English language summary.

The extended European search report issued on Nov. 18, 2013, which corresponds to EP13002580.2-1707 and is related to U.S. Appl. No. 13/893,042.

An Office Action issued by the Japanese Patent Office on Sep. 15, 2015, which corresponds to Japanese Patent Application No. 2012-113460 and is related to U.S. Appl. No. 13/893,042; with English language translation.

* cited by examiner

STORAGE DEVICE

BACKGROUND OF THE INVENTION

1. Field of the Invention

The present invention relates to a storage device in which plate-like members such as printed boards or pallets for component supply are stored vertically over a plurality of tiers in such a manner that the plate-like members can be loaded and unloaded to/from the storage device.

2. Background Art

Conventional examples of such storage devices include, for instance, component supply devices such as the one disclosed in Japanese Patent Application Publication No. 2009-147197. This component supply device supplies package-type electronic components (hereafter simply referred to as components) such as quad flat packages (QFPs) in a state where the components are stored in trays.

The component supply device comprises: a box-shaped housing; a stocker, supported on the inner sides of the housing, and in which pallets (plate-like members), having respective trays placed thereon, are stored vertically over a plurality of tiers; a stocker lifting and lowering device that lifts and lowers the stocker within the housing; and a drawing device that draws pallets out of the stocker. The housing is provided with a drawing port for drawing the pallets out at a predetermined height position, and the drawing device is disposed at a position in front of the drawing port. In this component supply device, components are supplied through lifting and lowering of the stocker, as a result of which a pallet having a desired component (tray) placed thereon stands opposite the drawing port, and, in this state, the pallet is drawn out by the drawing device.

In the above conventional component supply device (storage device), it is necessary to lift and lower the stocker in which the plurality of pallets is stored, as described above. The housing and so forth have to be higher rigid, and a substantial driving force is required, in order to stably lift and lower the comparatively heavy stocker. Accordingly, the component supply device has the drawbacks of being comparatively large and heavy, as well as costly. However, such component supply devices are extensively used thanks to the advantages that they afford, namely the fact that pallets can be loaded and unloaded at a specified height position, and that all movable portions are accommodated within the housing. Accordingly, it would be desirable to overcome the above drawbacks.

SUMMARY OF THE INVENTION

The present invention relates to a storage device for storing plate-like members such as component supply pallets or the like. An object of the present invention is to provide a storage device in which occupied space and weight can be curtailed, and in which costs can be reduced.

The storage device according to an aspect of the present invention is a storage device storing plate-like members vertically over a plurality of tiers, the storage device including: a storage member having, in a vertical direction, a plurality of parallel storage sections that are capable of storing the plate-like members; and a first lifting and lowering mechanism that causes the plate-like members, stored in the storage member, to move integrally in the vertical direction, while the position of the storage member in the vertical direction is maintained

DETAILED DESCRIPTION OF THE PREFERRED EMBODIMENTS OF THE INVENTION

Preferred embodiments of the present invention are explained in detail below with reference to accompanying drawings.

(First Embodiment)

Figure 1:
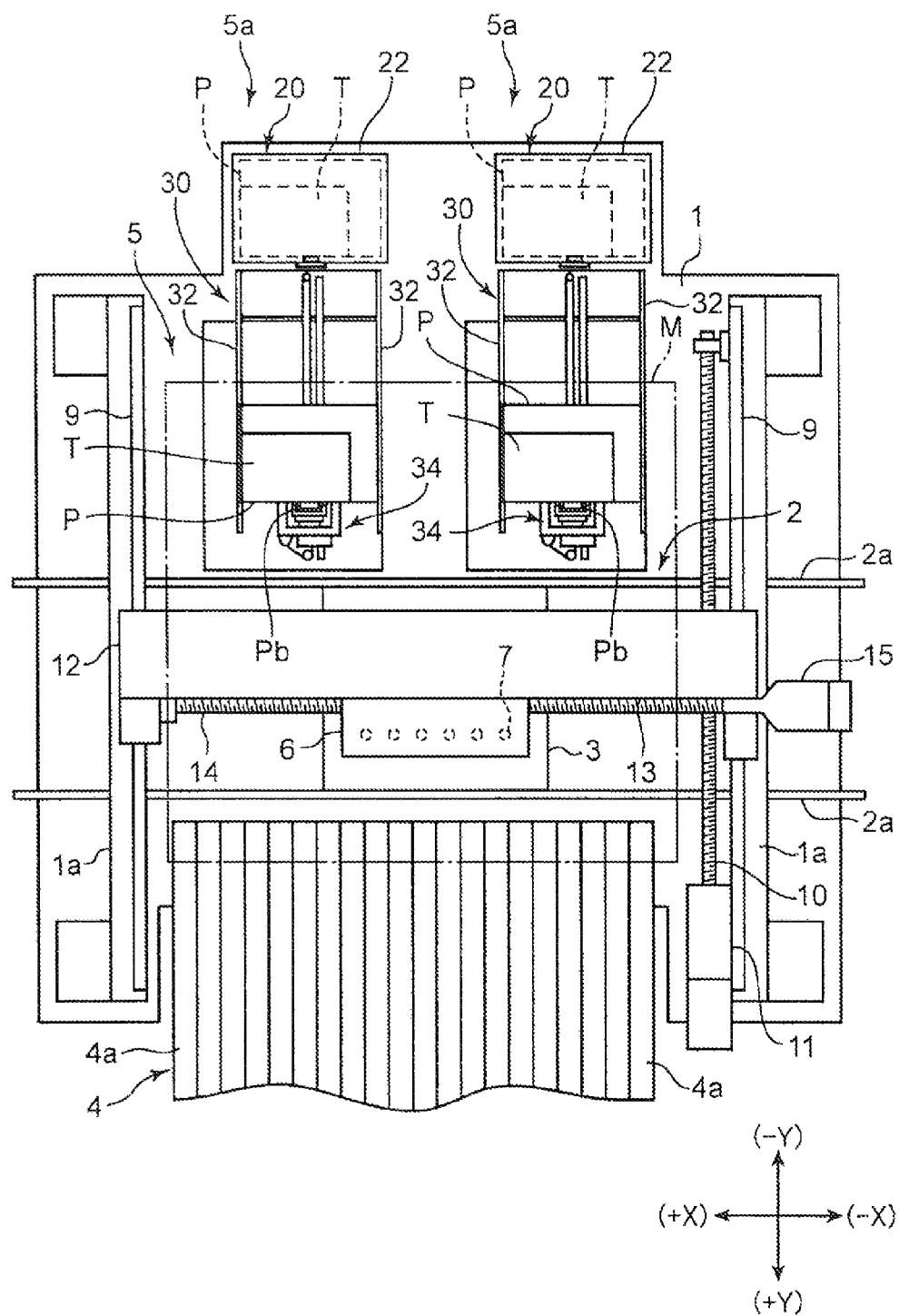
FIG. 1 is a plan-view diagram illustrating a component mounting device provided with a storage device (first embodiment) according to the present invention.
Figure 2:
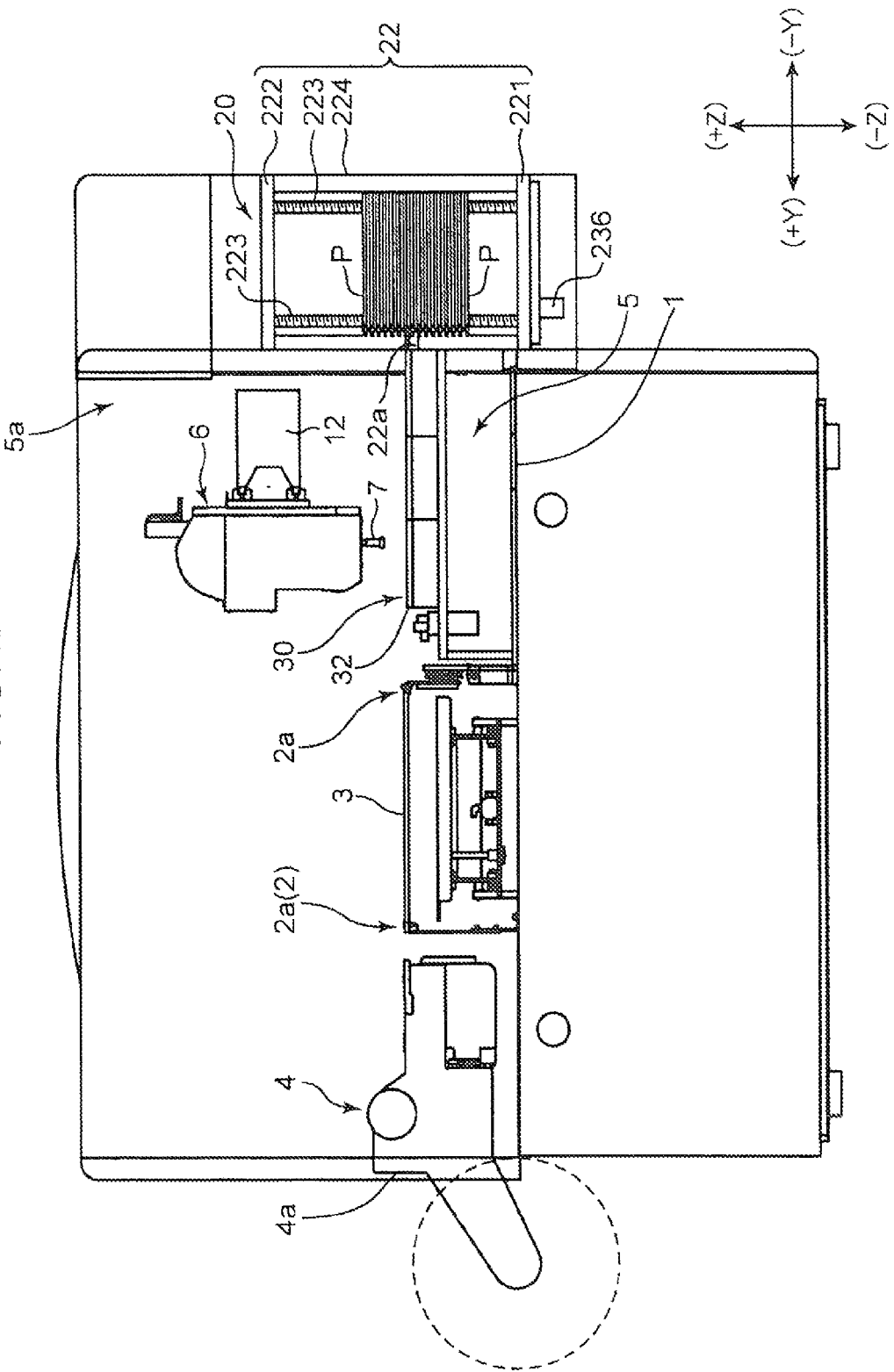
FIG. 2 is a side-view diagram illustrating the component mounting device.

In the first embodiment, a storage device according to the present invention is used as a tray component supply device of a component mounting device. FIG. 1 is a plan-view diagram illustrating a component mounting device, and FIG. 2 is a side-view diagram illustrating the component mounting device. To make direction relationships clear, XYZ orthogonal coordinate axes are depicted in the above figures and other figures hereafter.

The component mounting device comprises, for instance: a base 1; a substrate transport mechanism 2 that is disposed on the base 1 and that transports, in the X direction, substrates 3 such as printed wiring boards (PWBs); component supply units 4, 5; a head unit 6 for component mounting; and a head unit driving mechanism that drives the head unit 6.

The substrate transport mechanism 2 comprises a pair of belt conveyors 2a, on the base 1, that transport the substrates 3. The belt conveyors 2a receive each substrate 3 from the right in FIG. 1, and transport the substrate 3 up to a predetermined mounting operation position (position depicted in the figure), whereupon the substrate 3 is held by a holding device, not shown. After the mounting operation, holding of the substrate 3 is cancelled, and the substrate 3 is unloaded towards the left in the figure.

The component supply units 4, 5 are disposed on both sides (both sides in the Y direction) of the substrate transport mechanism 2. A plurality of tape feeders 4a juxtaposed in the X direction, along the substrate transport mechanism 2, is disposed on the component supply unit 4 at the front of the device (+Y direction side), from among the component supply units 4, 5. Each tape feeder 4a comprises a reel on which there is wound a tape that stores and holds small chip components such as ICs, transistors, capacitors or the like. The tape is paid out intermittently from the reel, and the components are supplied to a predetermined component supply position in the vicinity of the substrate transport mechanism 2. In the component supply unit 5 at the rear of the device (−Y direction side) there are parallelly disposed two tray component supply devices 5a in which package-type components (hereafter referred to simply as component) such as quad flat packages (QFPs) or ball grid arrays (BGAs) are supplied in a state where the components are stored on the trays. The tray component supply devices 5a, which are examples of the storage device according to the present invention, are connected parallelly in the X direction and removable at the rear (−Y direction side). The configuration of the tray component supply devices 5a will be explained in detail later on.

The head unit 6 can move in the X direction and the Y direction, within a given region, by virtue of the head unit driving mechanism The head unit driving mechanism comprises: a pair of fixed rails 9, respectively fixed to a pair of elevated frames 1a that are provided on the base 1, and extending parallelly to each other in the Y direction; a unit support member 12 that is supported by the fixed rails 9 and that extends in the X direction; and a ball screw shaft 10 that is screwed and inserted into the unit support member 12 and that is driven by a Y-axis servo motor 11. The head unit driving mechanism comprises a fixed rail 13 that is fixed to the unit support member 12 and that supports the head unit 6 in such a manner that the latter can move in the X direction, and a ball screw shaft 14 that is screwed and inserted into the head unit 6 and that is driven by an X-axis servo motor 15, as a driving source. The head unit driving mechanism causes the head unit 6 to move in the X direction, by means of the ball screw shaft 14, through driving of the X-axis servo motor 15, and causes the unit support member 12 to move in the Y direction, by means of the ball screw shaft 10, through driving of the Y-axis servo motor 11. As a result, the head unit 6 moves in the X direction and the Y direction within a given region.

The head unit 6 comprises, for instance, a plurality of mounting heads 7, each of which comprises, at the tip, a nozzle for component suction, and a head driving mechanism for causing the mounting heads 7 to rise and descend (movement in the Z direction) with respect to the head unit 6, and to rotate about the center axis of the respective nozzle. The head driving mechanism is driven by a servo motor not shown. The nozzles of the mounting heads 7 can each communicate with any one from among a negative pressure generator, a positive pressure generator and the atmosphere, by way of a respective electric selector valve. That is, the component can be suctioned by the nozzle through supply of negative pressure to the latter, and suction of the component is cancelled thereafter through supply of positive pressure.

The tray component supply devices 5a that are disposed on the component supply unit 5 are explained next with reference to FIG. 1 to FIG. 4.

The tray component supply devices 5a comprise each: a magazine 20 (corresponding to the storage device of the present invention) in which trays T, having components such as QFPs stored thereon, are stored vertically over a plurality of tiers, in a state where the trays T are placed on pallets P (corresponding to the plate-like members of the present invention); and a drawing mechanism 30 (corresponding to the plate-like member movement device of the present invention) that loads and unloads the pallets P to/from the magazine 20. By way of the drawing mechanism 30, each of the tray component supply devices 5a draws out the pallets P, from inside the magazine 20, towards the front of the magazine 20 (+Y direction); as a result, the components in the tray T supported on the pallet P are retrieved by the head unit 6. Each pallet P is a dish-shaped member having a rectangular shape in a plan view and provided with a peripheral wall section. The magazine 20 stores each pallet P in a state where the long sides of the pallet P are parallel to the X direction. The drawing mechanism 30 loads and unloads the pallets P in a direction (Y direction) parallel to the short sides of the pallets P.

As illustrated in FIG. 1 and FIG. 2, the magazine 20 comprises a box-shaped frame 22 having a rectangular cross-section, that stores a plurality of pallets P parallelly to each other in the vertical direction (Z direction), in such a manner that the pallets P can be loaded and unloaded; and a pallet lifting and lowering mechanism (corresponding to the first lifting and lowering mechanism of the present invention) that moves the pallets P stored in the box-shaped frame 22, in the vertical direction, while the positional relationship between the pallets P is maintained.

Figure 3:
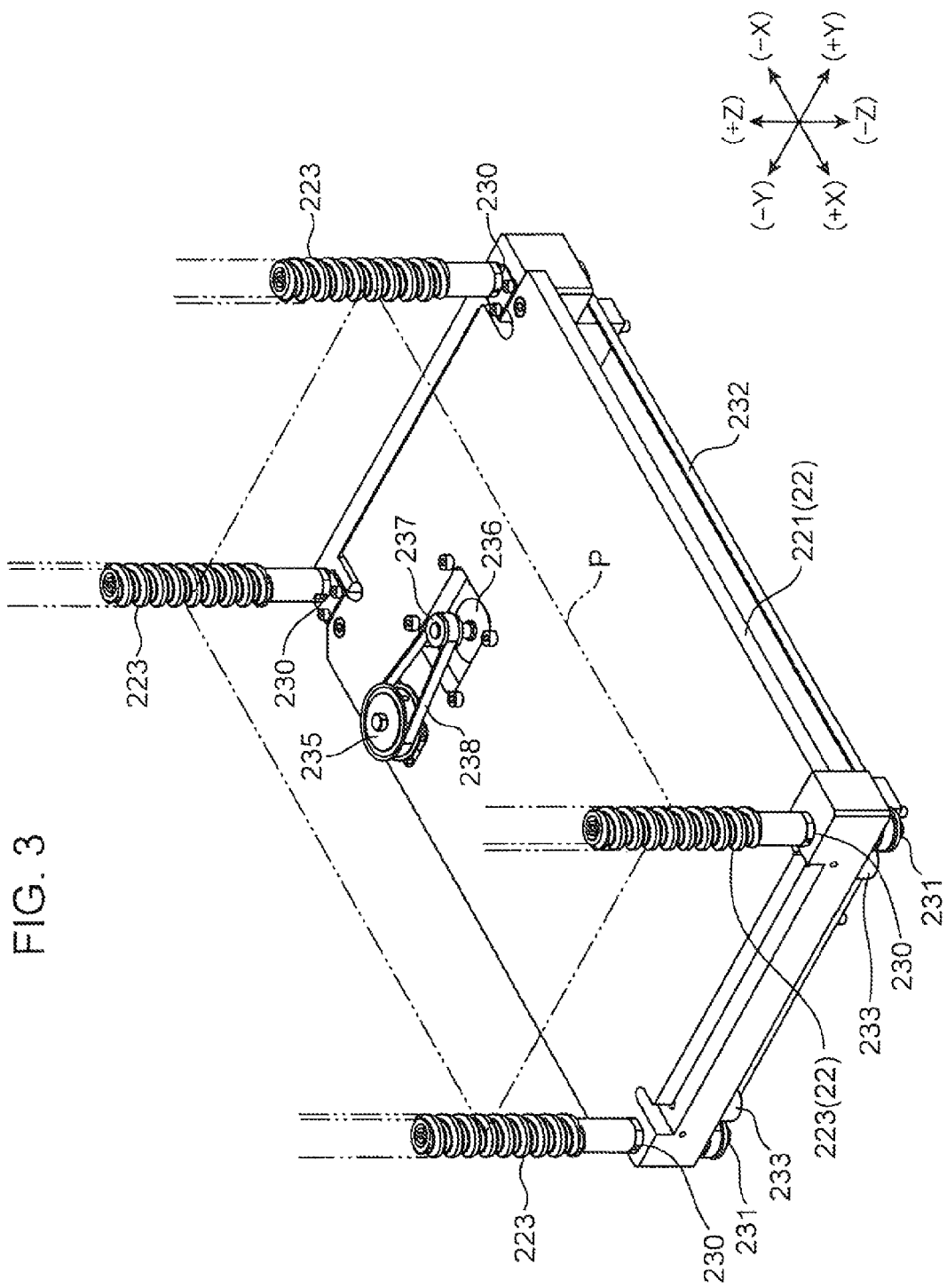
FIG. 3 is a perspective-view diagram illustrating the internal configuration of a magazine in the component supply device.

The box-shaped frame 22 comprises, for instance, a base plate 221 and a top plate 222 having both a rectangular plan-view shape, as illustrated in FIG. 2 and FIG. 3, four screw shafts 223 that are interposed between the plates 221, 222, and a side panel 224 that covers the pallets P from outside. The pallets P are supported on the plurality of screw shafts 223. In the present embodiment, the screw shafts 223 correspond to the storage member in which a plurality of storage sections that are capable of storing the pallets P is provided parallelly to each other in the vertical direction.

Figure 5:
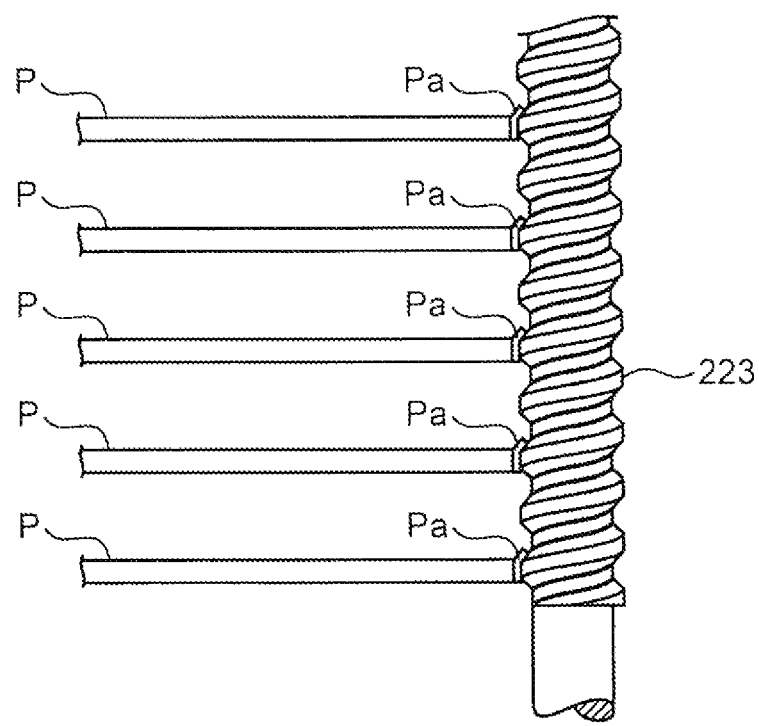
FIG. 5 is a side-view diagram illustrating a screw shaft and a pallet that is supported by the screw shaft.

In a more detailed explanation, the four screw shafts 223 are identical screw shafts wherein identically shaped thread crests are continuously formed substantially over the entirety of each screw shaft, from the base end section to the leading end section thereof. Each screw shaft is interposed between the plates 221, 222 at the positions of the four corners of the plates 221, 222. Each pallet P comprises, at both ends in the longitudinal direction thereof (X direction), a pair of flange sections Pa (see FIG. 5) that extend outward from the top end of the peripheral wall section of the pallet P. The flange sections Pa have a shape that enables the latter to be inserted onto the thread grooves (troughs) of the screw shafts 223. As illustrated in FIG. 5, the pallets P are inserted between the screw shafts 223 that are positioned at both ends in the width direction (X direction) of both plates 221, 222, and the flange sections Pa are inserted onto the thread grooves (troughs) of the screw shafts 223, as a result of which the flange sections Pa become supported by the screw shafts 223. In short, each pallet P is stored in the magazine 20, with thread grooves of identical height position of the screw shafts 223 serving as the storage section. In the present example, the pallets P are supported for instance alternately at every other thread groove in a side view, as illustrated in the figures.

Figure 4:
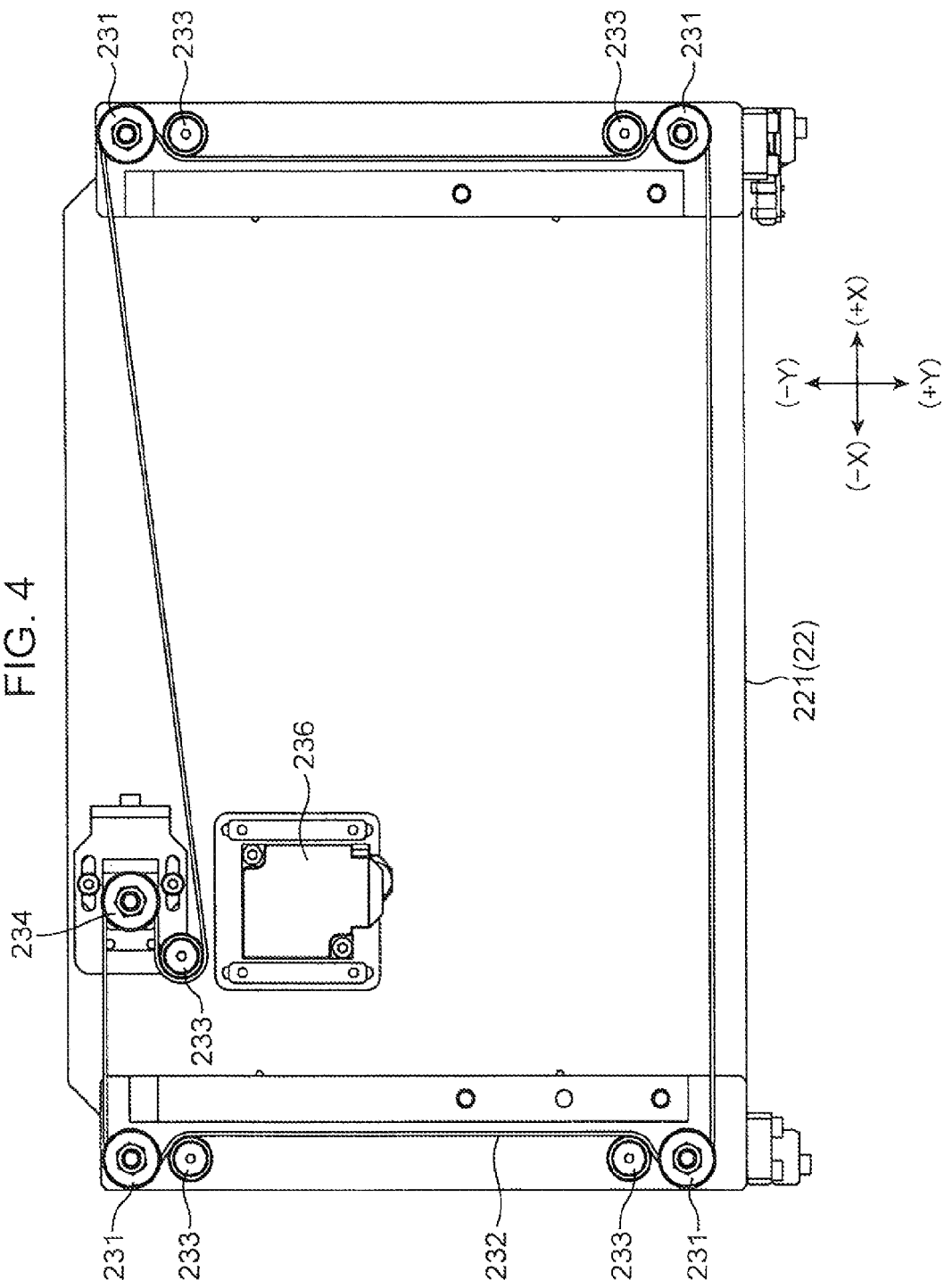
FIG. 4 is a bottom-view diagram of a magazine illustrating the configuration of a pallet lifting and lowering mechanism.

The pallet lifting and lowering mechanism causes the screw shafts 223 to rotate synchronously in the same direction; as a result, the pallets P that are supported on the screw shafts 223 are lifted and lowered integrally in a state where the vertical-direction positional relationship of the pallets P is maintained. Specifically, as illustrated in FIG. 3 and FIG. 4, the pallet lifting and lowering mechanism comprises screw shaft support sections 230, such as bearings or the like, that are provided between the base plate 221 and the top plate 222 and that support the respective screw shafts 223 in such a manner that the screw shafts 223 can rotate about the axes of the screw shaft support sections 230, and a rotation driving mechanism that causes the screw shafts 223 to rotate synchronously in a same direction. The rotation driving mechanism comprises: pulleys 231, below the base plate 221, that are fitted to respective screw shafts 223; an endless power transmission belt 232 wrapped around the pulleys 231; tension pulleys 233, 234 for tensioning the power transmission belt 232; a driving pulley 235 provided coaxially with the tension pulley 234; a motor 236; a pulley 237 fitted to the output shaft of the motor 236; and a driving belt 238 wrapped around the pulley 237 and the driving pulley 235. The pallet lifting and lowering mechanism transmits the rotation driving force of the motor 236 to the screw shafts 223, by way of the above pulleys and belts; as a result, the screw shafts 223 are caused to rotate synchronously, and the rotation direction of the screw shafts 223 is switched through switching of the driving direction of the motor 236. The pallet lifting and lowering mechanism moves thereby the pallets P in the vertical direction along the thread grooves, accompanying the rotation of the screw shafts 223.

A guide member, not shown, that guides the pallets P in the vertical direction while preventing offset of the pallets P in the horizontal direction, is provided in the box-shaped frame 22. The guide member elicits the effect of suppressing offset of the pallets P, in the horizontal direction with respect to the screw shafts 223, arising from the action exerted on the pallets P by the rotation force of the screw shafts 223.

An opening 22a for pallet loading and unloading is formed at the front face of the box-shaped frame 22 (side panel 224). The pallets P are loaded and unloaded, by the drawing mechanism 30, through that opening 22a. A door (not shown) is provided at the rear face of the box-shaped frame 22. This door is opened to open the box-shaped frame 22, and enable thereby operations such as exchange of the components (trays T) or replenishment of the components, from behind the magazine 20.

The magazine 20 is provided with the opening 22a at substantially the middle of the box-shaped frame 22 in the vertical direction (substantially the middle of the screw shafts 223). The magazine 20 is built into the component supply unit 5 in such a manner that the pallets P can be loaded and unloaded, by the drawing mechanism 30, via the opening 22a. The maximum number of stored pallets P in the magazine 20 is established in such a manner that the pallets P at the topmost position (topmost tier) and lowermost position (lowermost tier) face the opening 22a, through displacement of the pallets P in the vertical direction as a result of the operation of the pallet lifting and lowering mechanism. In consequence, the magazine 20 allows an arbitrary pallet P, from among the pallets P that are stored in the magazine 20, to be drawn out by the drawing mechanism 30 via the opening 22a.

As illustrated in FIG. 1 and FIG. 2, the drawing mechanism 30 is disposed at the front of the magazine 20. The drawing mechanism 30 comprises: a pair of guide rails 32 that support the flange sections Pa of the pallets P and that guide the pallets P in the front-rear direction (Y direction); a loading-unloading head 34 provided at a position between the guide rails 32 and capable of moving in the front-rear direction; and a driving mechanism for moving the loading-unloading head 34.

The loading-unloading head 34 is provided with a connection device that can latch to a hook Pb that is provided at the middle of the front end of each pallet P, and that can be switched between a latched state and a released state, for instance through the operation of an actuator such as an air cylinder or the like. The drawing mechanism 30 connects the loading-unloading head 34 to the pallet P, through latching of the connection device to the hook Pb of the pallets P, and, in that state, moves the loading-unloading head 34 in the front-rear direction; as a result, the pallet P is loaded and unloaded to/from the magazine 20, along the guide rails 32.

The driving mechanism of the loading-unloading head 34 comprises, for instance, driving pulleys disposed at intervals in the front-rear direction, an endless driving belt fitted to the driving pulleys and having one portion thereof fixed to the loading-unloading head 34, and a motor that rotationally drives the driving pulleys, such that the motor moves the loading-unloading head 34, by way of the driving belt.

A mounting operation of the components by the above-described component mounting device will be explained next. The explained operation relates to an instance where components that are taken from the tray component supply devices 5a are mounted onto the substrates 3.

In the mounting operation, firstly, a pallet P that supports the components (tray T) to be mounted, from among the components stored in the magazine 20, becomes disposed at a drawing height position (height position corresponding to the opening 22a) by the drawing mechanism 30. Specifically, the screw shafts 223 rotate synchronously in the same direction as a result of the operation of the pallet lifting and lowering mechanism, and, accompanying this rotation, the pallets P stored in the magazine 20 move integrally in the vertical direction along the thread grooves. As a result, the desired pallet P becomes disposed at a position corresponding to the opening 22a.

Next, the loading-unloading head 34 of the drawing mechanism 30 approaches the magazine 20, and becomes connected to the pallet P via the connection device. Thereafter, the loading-unloading head 34 moves in the opposite direction, i.e. towards the belt conveyors 2a. As a result, the pallet P is drawn out of the magazine 20 along the guide rails 32, and the components (tray T) supported on the pallet P become disposed at a predetermined component supply position that is set within the area of allowable motion of the head unit 6. Once the components (tray T) become thus disposed at the component supply position, the components on the tray T are retrieved by the head unit 6, are transported onto the substrate 3, and are mounted at a predetermined position on the substrate 3. If necessary, the components can be mounted in the same way while the head unit 6 moves back and forth between the tray T and the substrate 3.

In case of retrieval of all components from the tray T that is drawn out of the component supply position, or in case of retrieval of dissimilar components, the pallet P is returned to the magazine 20 in accordance with a reverse procedure of the above-described procedure, and thereafter a different pallet P is drawn out of the magazine 20.

As described above, the magazine 20 in each of the tray component supply devices 5a that are used in component mounting device are configured in such a manner that the pallets P are supported (stored) by the screw shafts 223, and in such a manner that, through rotation of the screw shafts 223, the pallets P stored in the magazine 20 are moved integrally in the vertical direction. In the magazine 20, specifically, only the stored pallets P can be moved integrally in the vertical direction while the position of the storage member on which the pallets P are stored (vertical-direction position of the screw shafts 223) is maintained, and while the positional relationship of the stored pallets P is maintained By virtue of the tray component supply devices 5a, therefore, it becomes possible to set, for instance, a lower output of the motor 236 and a lower strength of the box-shaped frame 22, as compared with a conventional device (Japanese Patent Application Publication No. 2009-147197 of the background art) where the pallets and the storage member thereof (stocker) are both moved. Accordingly, the tray component supply devices 5a afford proportional reductions in occupied space, weight and cost with respect to those of conventional devices.

In the tray component supply devices 5a, a pallet lifting and lowering mechanism is configured in such a manner that the pallets P are moved in the vertical direction through rotational driving of the storage member (screw shafts 223) that supports (stores) the pallets P. As a result, the pallets P can be moved by relying on an extremely simple configuration, while keeping small the space occupied by the pallet lifting and lowering mechanism, and by resorting to a comparatively small driving force. Therefore, the tray component supply devices 5a contribute, in this regards as well, to curtailing occupied space and weight, and to reducing costs.

In the above-described example of the magazine 20, the pallets P are supported by the four screw shafts 223, but the number of screw shafts 223 is not limited to four, so long as the pallet P can be supported stably and can be moved in the vertical direction.

(Second Embodiment)

In the second embodiment, the storage device according to the present invention is used in a loader. The loader is a device for stocking a plurality of substrates, such as printed wiring boards, and for delivering the substrates one by one onto a production line of component-mounted substrates.

Figure 6:
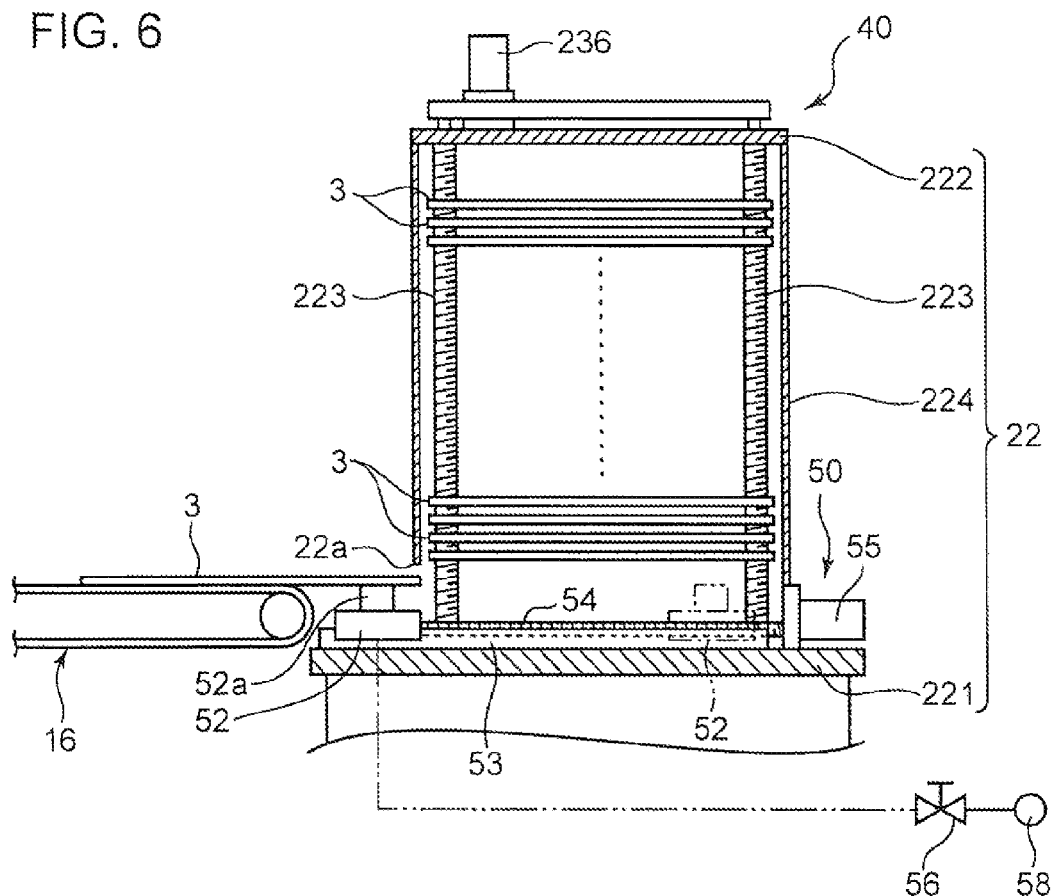
FIG. 6 is a cross-sectional schematic diagram illustrating a storage device (second embodiment) according to the present invention.
Figure 7:
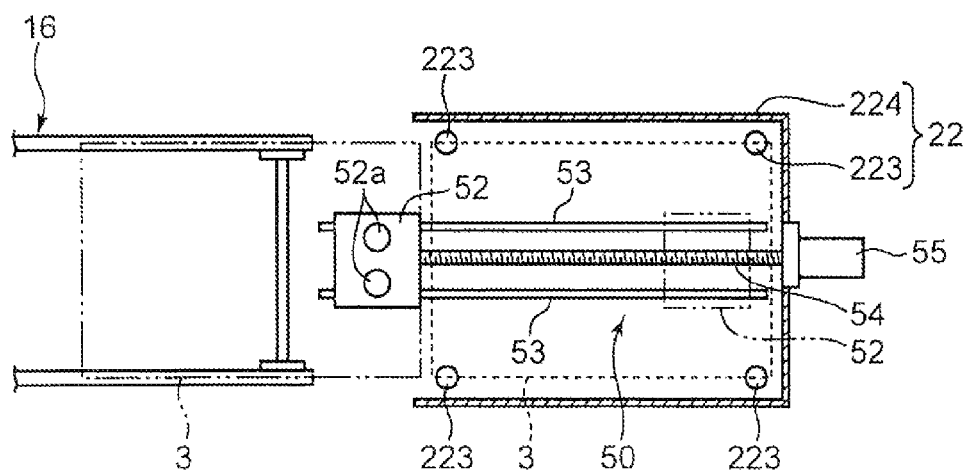
FIG. 7 is a cross-sectional schematic diagram illustrating the storage device.

The abovementioned loader is illustrated in FIG. 6 and FIG. 7. FIG. 6 is a cross-sectional diagram, in the vertical direction, and FIG. 7 is a cross-sectional diagram, in the horizontal direction, illustrating the loader schematically.

As illustrated in the figures, the loader is disposed so as to oppose a substrate transport mechanism 16 such as a belt conveyor or the like. The loader comprises a magazine 40 that stores, vertically over a plurality of tiers, substrates 3 (corresponding to the plate-like member of the present invention) before component mounting, and a delivery mechanism 50 (corresponding to the plate-like member movement device of the present invention) that delivers the substrates 3 from the magazine 40. By means of the delivery mechanism 50, the loader delivers the substrates 3 in the magazine 40 towards the front of the magazine 40 (leftward in the figures); as a result, the substrates 3 are transferred onto the substrate transport mechanism 16 that is disposed at the front.

The magazine 40 has substantially the same configuration as the magazine 20 of the first embodiment, except for the fact that now the plate-like members, as the object to be stored, are the substrates 3. Accordingly, portions shared with the magazine 20 of the first embodiment will be denoted by the same reference numerals, and will not be explained. The explanation below will focus mainly on differences with respect to the magazine 20.

The magazine 40 comprises a box-shaped frame 22 that stores the plurality of substrates 3, parallelly to each other in the vertical direction, in a state where the substrates 3 can be drawn towards the front of the magazine 40; and a substrate lifting and lowering mechanism (corresponding to the first lifting and lowering mechanism of the present invention) that can integrally lift and lower the stored substrates 3 in a state where the vertical-direction positional relationship of the substrates 3 is maintained.

A base plate 221 of the box-shaped frame 22 doubles as a base of the loader. An opening 22a for delivering the substrates 3 is formed at a position in the vicinity of that base, i.e. at the lower end section of the front face of the box-shaped frame 22. The screw shafts 223 are formed in such a manner that the substrates 3 can be supported by the screw shafts 223 by end sections of the substrates 3 being inserted in thread grooves (troughs) of screw shafts 223.

The substrate lifting and lowering mechanism, which has the same configuration as the pallet lifting and lowering mechanism of the first embodiment, causes the substrates 3 to move along the thread grooves accompanying the rotation of the screw shafts 223. In the magazine 40, however, the substrate lifting and lowering mechanism operates only to lower the substrates 3, for the purpose of delivering the substrates 3 through the opening 22a that is provided at the lower end section of the magazine 40. In the magazine 40, a motor 236 as well as pulleys, belts and so forth that make up the substrate lifting and lowering mechanism are assembled on a top plate 222 of the box-shaped frame 22.

As illustrated in the figures, the delivery mechanism 50 is provided at an inner bottom section of the magazine 40, i.e. on the base plate 221. The delivery mechanism 50 comprises: a pair of rails 53 that are fixed to the base plate 221 and that extend in the front-rear direction (left-right direction in the figures); a delivery head 52 that is movably supported on the rails 53; and a screw shaft 54 that is screwed and inserted into the delivery head 52 and that is rotationally driven by a motor 55; such that driving of the screw shaft 54 causes the delivery head 52 to move into and out of the magazine 40, in the front-rear direction. The delivery head 52 comprises holding sections 52a that hold the substrates 3 through suction of the underside of the substrates 3. The delivery head 52 can communicate with any one from among a negative pressure/positive pressure generator 58 and the atmosphere, via electric selector valve 56. That is, the delivery mechanism 50 holds the substrates 3 through suction of the underside of the substrates 3, and, in that state, causes the delivery head 52 to move, as a result of which the substrates 3 are delivered out of the magazine 40 towards the front of the latter.

The delivery operation of the substrates 3 by the loader proceeds as follows. Firstly, the substrate lifting and lowering mechanism is operated in a state where the delivery head 52 is disposed at a predetermined position in the magazine 40; then, the substrates 3 in the magazine 40 are lowered integrally until the lowermost (lowermost tier) substrate 3 is at a predetermined delivery height position, i.e. the substrates 3 are lowered to a height position at which the lowermost (lowermost tier) substrate 3 can be held by the delivery head 52. Upon reaching the predetermined delivery height position, the lowermost substrate 3 is suctioned and held by the delivery head 52 (holding sections 52a). In this state, the delivery head 52 moves up to a predetermined substrate transfer position outward and forward of the magazine 40, and the substrate 3 is transferred to the substrate transport mechanism 16. To accomplish this transfer, the delivery head 52 cancels suction of the substrate 3 at the point in time where the latter becomes supported on the substrate transport mechanism 16. The delivery head 52 is reset thereafter into the magazine 40. Subsequently, the above operation is performed repeatedly, and the substrates 3 stored in the magazine 40 become sequentially delivered as a result starting from the lowermost substrate 3.

In such a loader, the magazine 40 is configured in such a manner that the substrates 3 are supported (stored) by the screw shafts 223. Accordingly, a substrate lifting and lowering mechanism is configured such that the substrates 3 stored in the magazine 40 are moved in the vertical direction through rotational driving of the screw shafts 223. Therefore, this contributes to curtailing the occupied space and weight of the loader, and to reducing costs, in the same way as in the tray component supply devices 5a of the first embodiment.

The loader is configured in such a manner that the substrates 3 stored in the magazine 40 are delivered through the opening 22a while being sequentially moved downward, but a reverse configuration is also possible, namely a configuration wherein the opening 22a is provided in the vicinity of the upper end section of the magazine 40, and the substrates 3 stored in the magazine 40 are delivered through the opening 22a while being sequentially moved upward. In this case, the delivery mechanism 50 is provided at the top of the magazine 40.

(Third Embodiment)

In the third embodiment, the storage device according to the present invention is used as a substrate buffer device, i.e. as a device for drawing and stocking substrates that are transported along a production line of component-mounted substrates, and for returning the substrates to the production line if necessary.

Figure 8:
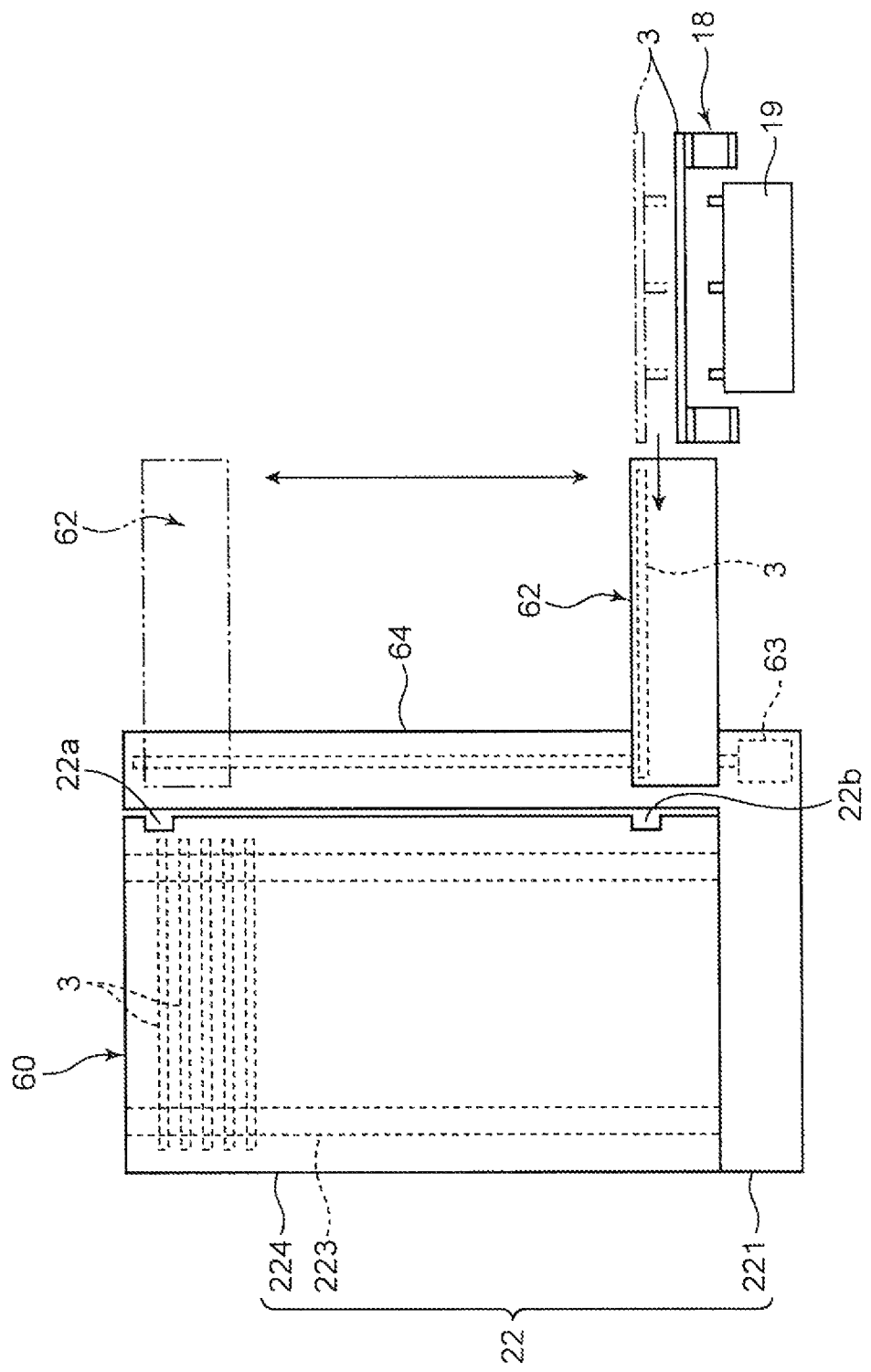
FIG. 8 is a side-view schematic diagram illustrating a storage device (third embodiment) according to the present invention.

FIG. 8 is a side-view diagram illustrating schematically the above buffer device. The buffer device is disposed on the side of a substrate transport mechanism 18, such as a belt conveyor, i.e. in the substrate transport mechanism 18, corresponding to a predetermined substrate loading-unloading section at which a below-described substrate raising mechanism 19 is disposed.

The buffer device comprises: a magazine 60 that is capable of storing vertically, over a plurality of tiers, substrates 3 (corresponding to the plate-like members of the present invention); a relay device 62 (corresponding to the plate-like member movement device of the present invention) that transfers the substrates 3 between the magazine 60 and the substrate transport mechanism 18; and a relay device driving mechanism (corresponding to the second lifting and lowering mechanism of the present invention) that moves the relay device 62 in the vertical direction. The buffer device is configured in such a manner that by way of the relay device 62, the substrates 3 on the substrate transport mechanism 18 are drawn and stored in the magazine 60, and the substrates 3 stored in the magazine 60 are returned, as needed, to the substrate transport mechanism 18.

The magazine 60 has substantially the same configuration as the magazine 40 of the second embodiment. Accordingly, portions shared with the magazine 40 of the second embodiment will be denoted by the same reference numerals, and will not be explained. The explanation below will focus mainly on features that are different. In the third embodiment, two upper and lower openings 22a, 22b for substrate loading and unloading are provided at the front face (right face in the figure) of the magazine 60 (box-shaped frame 22). From among these openings 22a, 22b, the opening 22a at the top (referred to as upper opening 22a) is an opening for storing the substrates 3 into the magazine 60, and is positioned in the vicinity of the upper end section of the magazine 60. The opening 22b at the bottom (referred to as lower opening 22b), is an opening for drawing substrates 3 out of the magazine 60, and is positioned in the vicinity of the lower end section of the magazine 60.

Although not shown in the figure, the relay device 62 comprises guide rails, extending in the front-rear direction (left-right direction in the figure), for supporting and guiding the substrates 3, and a loading-unloading head that can move in a direction parallel to the guide rails. The relay device 62 is configured in such a manner that the substrates 3 are drawn onto the guide rails, out of the substrate transport mechanism 18, by the loading-unloading head, and in such a manner that the substrates 3 are stored into the magazine 60 along the guide rails. The loading-unloading head, which has for instance a configuration similar to that of the delivery head 52 explained in the second embodiment, holds the substrates 3 through suction of the underside thereof. The relay device driving mechanism is, for instance, a screw feed mechanism that relies on a motor 63 as a driving source, and that causes the relay device 62 to move along a guide member 64 that is provided in front of the magazine 60.

The loading and unloading operation of the substrates 3 by the buffer device is as follows.

Upon stocking of the substrates 3 in the magazine 60, firstly, the substrates 3 are disposed at a predetermined height position at which the substrates can be drawn in. Specifically, the relay device 62 moves to a height position that corresponds to a substrate 3 that has been raised by the substrate raising mechanism 19 that is ancillary to the substrate transport mechanism 18; thereafter, the loading-unloading head holds the substrate 3 and draws the latter in along the guide rails. The substrate raising mechanism 19 is provided with pin members that can move in the vertical direction and that comprise, at the tip, a rotating body, such as a ball. The pin members thrust against the substrate 3, from below, and, as a result, the substrate 3 is raised off the substrate transport mechanism 18.

Once the substrate 3 is drawn onto the relay device 62, the relay device 62 rises up to a predetermined storage height position opposite the upper opening 22a; thereafter, the substrate 3 becomes stored in the magazine 60, out of the relay device 62, along the guide rails, accompanying the motion of the loading-unloading head. The end sections of the substrate 3 are inserted thereupon onto the thread grooves (troughs) of screw shafts 223, as a result of which the substrate 3 becomes stored in the magazine 60 in a state where the substrate 3 is supported on the screw shafts 223. Upon storage of the substrates 3, the substrates 3 inside the magazine 60 are moved down integrally beforehand, through operation of the substrate lifting and lowering mechanism, to bring about thereby a state in which the substrate 3 can be stored topmost in the magazine 60.

In a case where the substrates 3 stocked in the magazine 60 are to be returned to the substrate transport mechanism 18, the substrates 3 stored in the magazine 60 are integrally lowered, through operation of the substrate lifting and lowering mechanism, in such a manner that the lowermost (lowermost tier) substrate 3 is disposed at a height position corresponding to the lower opening 22b. The relay device 62 becomes disposed at a position corresponding to the lower opening 22b. In this state, the substrate 3 is drawn out by the loading-unloading head onto the guide rails, out of the magazine 60, through the lower opening 22b; thereafter, the substrate 3 is pushed out from the relay device 62 towards the substrate transport mechanism 18, along the guide rails, accompanying the movement of the loading-unloading head. The pin members of the substrate raising mechanism 19 are disposed thereupon at a raised position, and the substrate 3 is transferred as a result from the relay device 62 onto the pin members. Thereafter, the pin members are lowered, and the substrate 3 is returned onto the substrate transport mechanism 18. After the substrate 3 has been retrieved from the magazine 60, the substrates 3 in the magazine 60 are moved down integrally, through the operation of the substrate lifting and lowering mechanism. A next substrate 3 is made ready thereby, beforehand, at the lowermost position in the magazine 60.

In a buffer device such as the above-described one, the magazine 60 has a configuration similar to that of the magazines 20, 40 in the first and the second embodiments. Therefore, this contributes to curtailing the occupied space and weight of the buffer device, and to reducing costs, as in the case of the first and the second embodiments.

In the above-described buffer device, the substrates 3 are stored in the magazine 60 through the upper opening 22a, and are drawn out through the lower opening 22b, but needless to say, the opposite is also possible. In the latter case, the substrates 3 are loaded and unloaded according to an operation that is the upside-down reverse of the above-described operation.

Ordinarily, the substrates 3 are loaded and unloaded through either the upper or the lower opening 22a (or 22b), but the other opening 22b (22a) may also be used, as the case may require. A configuration is also possible in which either the upper or lower opening is omitted, and the substrates 3 are loaded and unloaded through the opening 22a (or 22b) alone.

Figure 9:
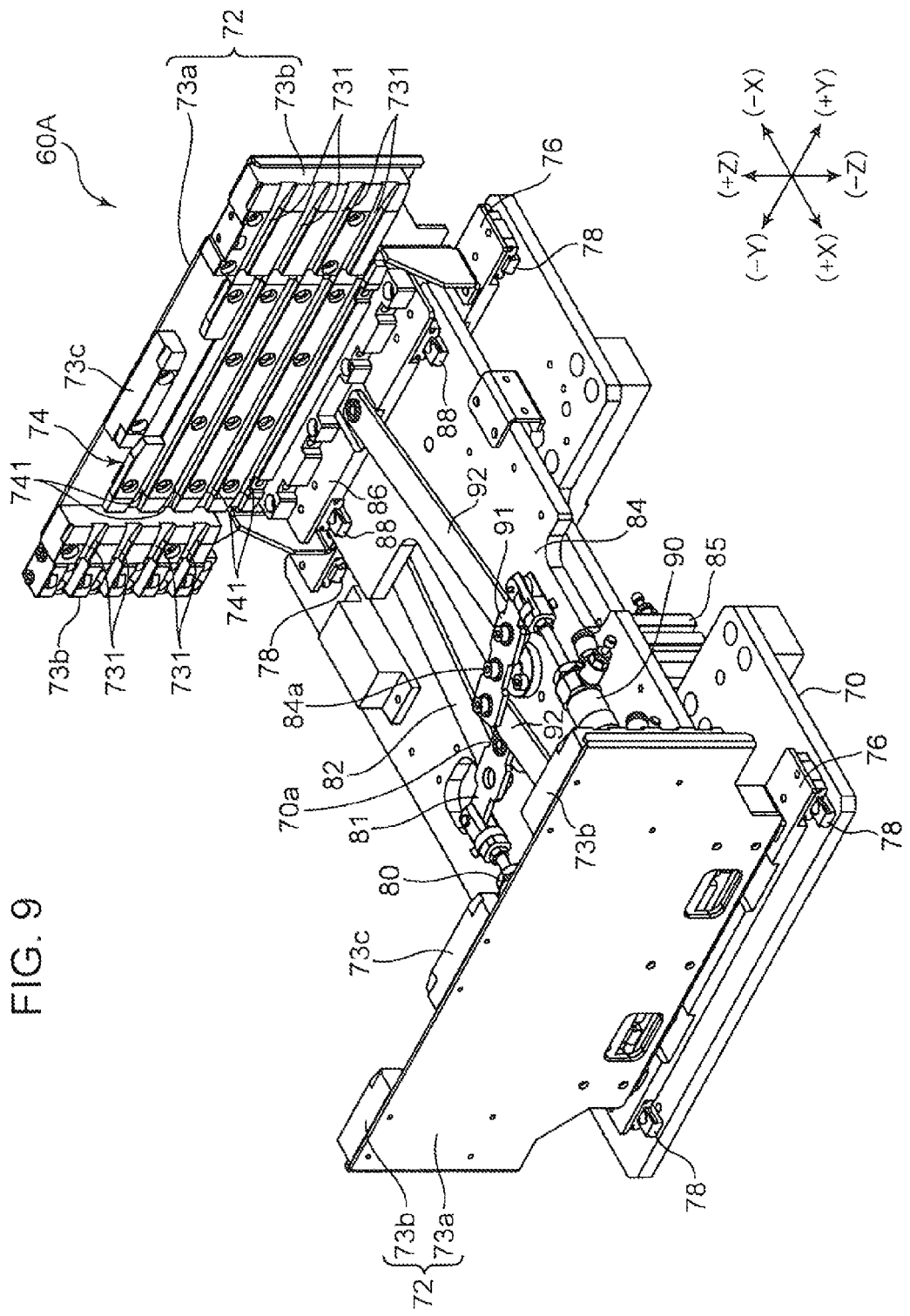
FIG. 9 is a perspective-view diagram illustrating a variation of a magazine.
Figure 10:
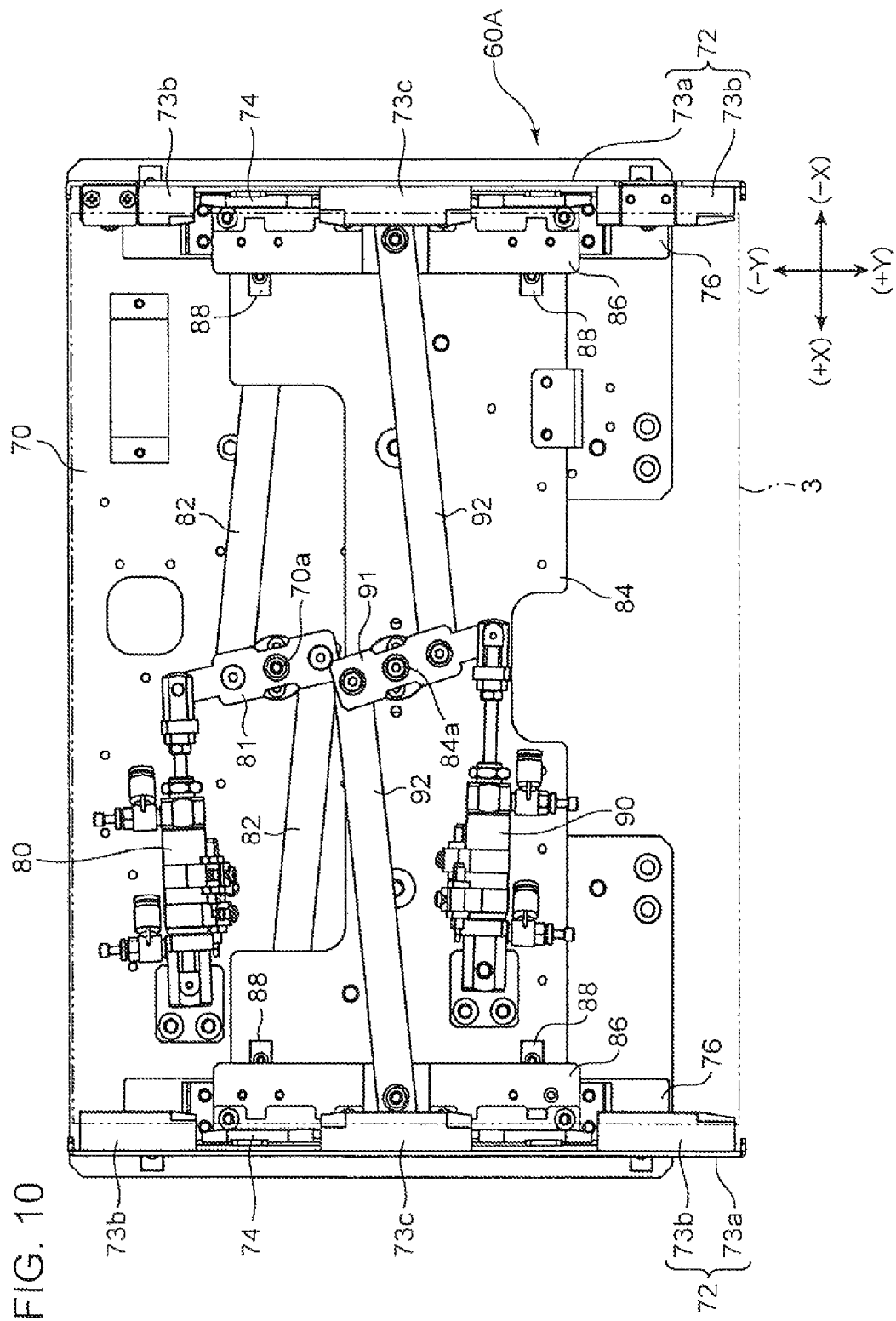
FIG. 10 is a plan-view diagram illustrating a magazine.

In the buffer device a magazine 60A such as the one illustrated in FIG. 9 and FIG. 10 can be used instead of the magazine 60.

This magazine 60A will be explained next. In the figures, XYZ orthogonal coordinate axes are depicted in order to clarify direction relationships. Herein, the +Y side denotes the front of the magazine 60A, i.e. the side on which the relay device 62 is disposed (right side in FIG. 8).

The magazine 60A comprises: a base plate 70 substantially rectangular in a plan view; a pair of plate-like first substrate support members 72 mutually opposing in the width direction (X direction) of the base plate 70, and positioned on both ends of the base plate 70 in the width direction thereof; a pair of plate-like second substrate support members 74 disposed in the vicinity of the first substrate support members 72, juxtaposed inward of the latter, and being arrayed opposing each other in the width direction; a first support member driving mechanism that moves the first substrate support members 72 in the direction in which the latter are arrayed (X direction); and a second support member driving mechanism that moves the second substrate support members 74 in the direction (X direction) in which the latter are arrayed and in the vertical direction (Z direction).

In the magazine 60A, the pair of first substrate support members 72 corresponds to the pair of storage members of the present invention; rails 78 correspond to the storage member support sections of the present invention; the first support member driving mechanism corresponds to the storage member driving mechanism of the present invention, and the second substrate support members 74, the second support member driving mechanism and so forth correspond to the feed mechanism of the present invention.

Each first substrate support member 72 in the pair of first substrate support members 72 comprises an elongated plate 73a, substantially rectangular in a side view, extending in the front-rear direction (Y direction); a pair of support blocks 73b that are respectively fixed to both ends in the front-rear direction of the plate 73a, on the opposing face of the plate 73a; and an intermediate block 73c that is fixed to the plate 73a at a position between the support blocks 73b, at the top edge of the opposing face of the plate 73a.

The support blocks 73b of the first substrate support members 72 have each a plurality of tiers of guide grooves 731 that are juxtaposed in the vertical direction, opposing each other, and that extend in the front-rear direction. Both ends of the substrate 3 can be supported from outside, in the X direction, through insertion of both ends of the substrate 3 into the guide grooves 731. The support blocks 73b comprise each four guide grooves 731. In the first substrate support members 72, the substrates 3 are supported by the guide grooves 731, and also supported on the top faces of the support blocks 73b and the intermediate block 73c. In the magazine 60A, therefore, at most five substrates 3 can be stored in a state of being supported parallelly to each other in the vertical direction.

In this example, the guide grooves 731 of the support blocks 73b of the first substrate support members 72, and the top faces of the support blocks 73b and the intermediate block 73c correspond to the shelves of the present invention. Guide grooves having a same height, among the guide grooves 731 of the support blocks 73b, as well as the top faces of the support blocks 73b and the intermediate block 73c, correspond respectively to the storage sections of the present invention.

Each of the first substrate support members 72 is supported, via base 76, in such a manner that the substrate support member 72 can move along rails 78 that extend in the X direction and that are fixed to the base plate 70. Specifically, each of the first substrate support members 72 is supported on the rails 78 in such a manner that the first substrate support member 72 can move over an approach position at which the substrates 3 are supported by the pair of support blocks 73b, and a separation position, having a wider spacing than that of the approach position, and at which the substrates 3 between both first substrate support members 72 are allowed to move in the vertical direction. The first substrate support members 72 are driven by the first support member driving mechanism.

The first support member driving mechanism comprises: a first link member 81 that extends in the front-rear direction and that is rotatably supported, by way of a support shaft 70a, to the base plate 70, at substantially the middle of the first link member 81 in the longitudinal direction thereof; a pair of second link members 82, having the support shaft 70a as a boundary therebetween, and that connect, by way of respective hinge structures, both ends of the first link member 81, in the longitudinal direction thereof, with respective bases 76; and an air cylinder 80, connected to the first link member 81 by way of a hinge structure, and that drives the first link member 81 about the support shaft 70a in response to switching between supply and shutoff of air pressure. In the first support member driving mechanism, the air cylinder 80 causes the first link member 81 to swing about the support shaft 70a; and the first substrate support members 72 move to the approach position and the separation position accompanying swinging of the first link member 81 via the second link members 82.

The pair of second substrate support members 74 is a pair of elongated plate-like block members, substantially rectangular in a side view, that extend in the front-rear direction (Y-direction). The second substrate support members 74 are each disposed interposed between the front and rear support blocks 73b at the front and rear of each first substrate support member 72, inside of the plates 73a of the pair of first substrate support members 72. The second substrate support members 74 comprise each four guide grooves 741, on opposing faces, such that the guide grooves 741 are juxtaposed in the vertical direction and extend in the front-rear direction. The substrates 3 can be supported through insertion of the end sections of the substrates 3 into these guide grooves 741.

The second substrate support members 74 are assembled onto a movable plate 84 that can rise and descend on the base plate 70 by way of a guide member not shown. As a result, the second substrate support members 74 are supported so as to be capable of rising and descending with respect to the base plate 70, via the movable plate 84. Specifically, the second substrate support members 74 are supported so as to be capable of moving over a raised position at which all (four) guide grooves 741 match respective guide grooves 731 of the support blocks 73b, and a down position at which the guide grooves 741 are shifted downward, with respect to the first substrate support members 72, by one pitch of the guide grooves 741. The second substrate support members 74 are also supported so as to be capable of moving, by way of the base 86, on rails 88 that are fixed to the movable plate 84 and that extend in the X direction. Specifically, the second substrate support members 74 are supported on the rails 88 in such a manner that the second substrate support members 74 can move over an approach position at which the substrates 3 can be supported, and a separation position, having a spacing wider than that of the approach position, and at which the substrates 3 between both second substrate support members 74 are allowed to move in the vertical direction.

The second support member driving mechanism comprises an air cylinder 85 fixed to the underside of the base plate 70, and that causes the movable plate 84 to move in the vertical direction, with respect to the base plate 70, in response to switching between supply and shutoff of air pressure. The second support member driving mechanism comprises: a first link member 91 that extends in the front-rear direction and that is rotatably supported, by way of a support shaft 84a, to the movable plate 84, at substantially the middle of the first link member 91 in the longitudinal direction thereof; a pair of second link members 92, having the support shaft 84a as a boundary therebetween, and that connect, by way of respective hinge structures, both ends of the first link member 91, in the longitudinal direction thereof, with respective bases 86; and an air cylinder 90, connected to one longitudinal-direction end section of the first link member 91 by way of a hinge structure, and that drives the first link member 91 about the support shaft 84a in response to switching between supply and shutoff of air pressure. In the second support member driving mechanism, thus, the movable plate 84 is raised and lowered by the air cylinder 85, and, as a result, the second substrate support members 74 are moved to the raised position and the down position, and the air cylinder 90 causes the first link member 91 to swing about the support shaft 84a, so that the second substrate support members 74 move as a result to the approach position and the separation position, in response to the swinging of the first link member 91, by way of second link members 92.

In a state where both first substrate support members 72 and both second substrate support members 74 are disposed at the approach position, the positions of the guide grooves 731 (inner bottom section) of the support blocks 73b of the first substrate support members 72 match, in the X direction, the positions of the guide grooves 741 (inner bottom section) of the second substrate support members 74; as a result, the substrates 3 can be supported on both first substrate support members 72 as well as on both second substrate support members 74. When, from this state, both first substrate support members 72 alone become disposed at the separation position, the positions of the guide grooves 731 of both support blocks 73b of the first substrate support members 72 are offset outward, in the X direction, with respect to the positions of the guide grooves 741 of the second substrate support members 74. That is, the positions of the guide groove 731 of both support blocks 73b of the first substrate support members 72 become offset, in the X direction, outward of the positions of the X-direction end section of the substrates 3 that are supported on the second substrate support members 74. As a result, both second substrate support members 74 can move in the vertical direction at a position inward of the plates 73a of both first substrate support members 72, with the substrates 3 supported on the second substrate support members 74.

The second substrate support members 74 are formed so that the thickness dimension of the second substrate support members 74 (thickness dimension in the X direction) is smaller than the thickness dimension of the support blocks 73b of the first substrate support members 72, in such a manner that the second substrate support members 74 can move to the approach position and the separation position in a state where the first substrate support members 72 are disposed at the approach position. As a result, the support state of the substrates 3 by the second substrate support members 74 can be cancelled through displacement of just the second substrate support members 74 to the separation position, while the support state of the substrates 3 by the first substrate support members 72 (support blocks 73b) is maintained, as illustrated in FIG. 10. That is, the positions of the opposing faces of both second substrate support members 74 can be disposed outward, in the X direction, of the positions of the guide grooves 731 (inner bottom section) of the support blocks 73b of both first substrate support members 72. In this state as well, there is maintained the gap between the plates 73a of the first substrate support members 72 and the second substrate support members 74, and the second substrate support members 74 can move in the vertical direction at the separation position.

In the magazine 60A, the substrates 3 can be supported in a state where the first substrate support members 72 are set to the approach position and the second substrate support members 74 are set to the approach and raised positions. In that state, the substrates 3 are loaded and unloaded by the relay device 62 (FIG. 8). In that state, specifically, the four guide grooves 731 of the first substrate support members 72 and the four guide grooves 741 of the second substrate support members 74 match each other in the vertical direction; as a result, there are formed four groove sections, juxtaposed in the vertical direction, and in which the substrates 3 can be supported, and one support section on which the substrates 3 can be supported becomes formed by the top faces of the support blocks 73b of the first substrate support members 72 and the top faces of the second substrate support members 74. A maximum of five substrates 3 can be supported as a result.

Figure 11A:
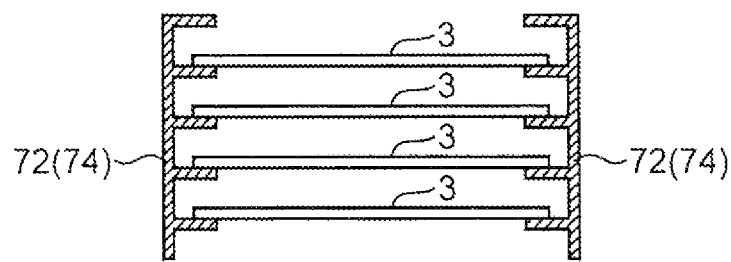
FIGS. 11A to 11C are schematic diagrams for explaining an operation of moving substrates up in a magazine.
Figure 11B:
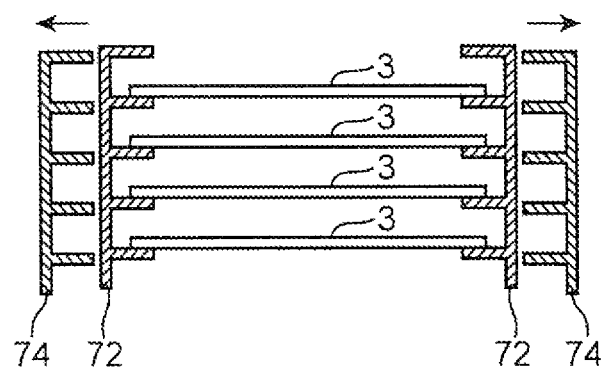
Figure 11C:
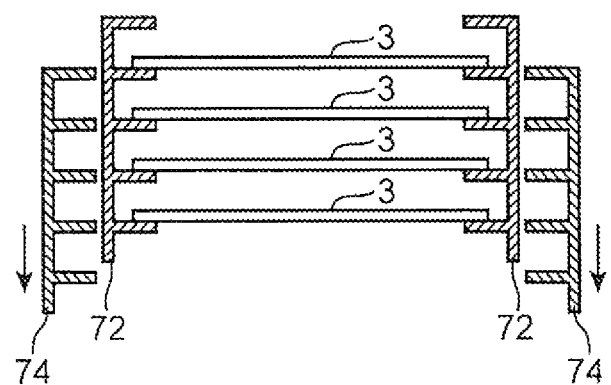

An explanation follows next, with reference to FIG. 11 and FIG. 12, on the raising and lowering operation of the substrates 3 in the magazine 60A. The figures illustrate conceptually the operation of the substrate support members 72, 74. For structural reasons, the second substrate support members 74 do not actually move outward of the first substrate support members 72, but for the convenience of explanation, the second substrate support members 74 are depicted in some of the figures (for instance, FIG. 11C and so forth) as moving outward of the first substrate support members 72.

The explanation below will assume that the substrates 3 are supported (stored), except for the topmost tier (topmost position), as illustrated in FIG. 11A. At this time, as described above, the first substrate support members 72 are set to the approach position, and the second substrate support members 74 are set to the approach and raised positions.

Figure 12A:
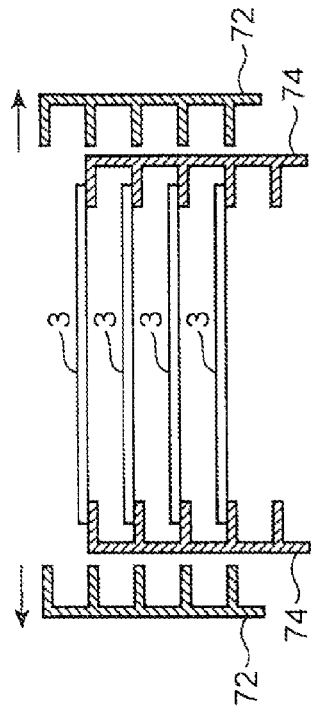
FIGS. 12A to 12D are schematic diagrams for explaining an operation of moving substrates up in a magazine.
Figure 12B:
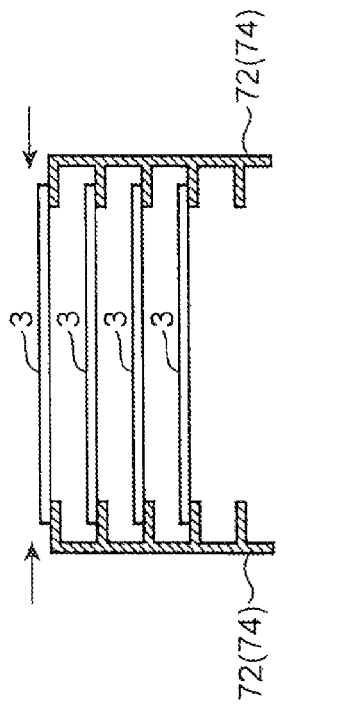
Figure 12C:
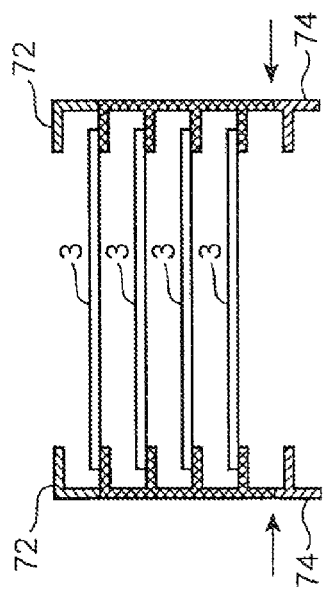
Figure 12D:
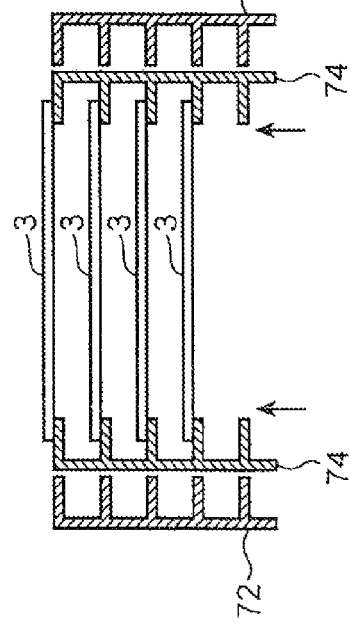

Firstly, the second substrate support members 74 move to the separation position, move then from the raised position to the down position, and move thereafter from the separation position to the approach position (FIG. 11B, FIG. 11C and FIG. 12A). As a result, the second substrate support members 74 become offset downward with respect to first substrate support members 72, and the positions of the guide grooves 741 of the second substrate support members 74 on which the substrates 3 are supported shift upward by one tier. Next, the first substrate support members 72 move to the separation position, and, in this state, the second substrate support members 74 move from the down position to the raised position, after which the first substrate support members 72 move from the separation position to the approach position (FIG. 12B to FIG. 12D). Thereby, the positions of the guide grooves 731 of the first substrate support members 72 on which the substrates 3 are supported shift upward by one tier, and, as a result, the positions of the substrates 3 supported in the magazine 60A move up together by one tier, while the positional relationship between the substrates 3 is maintained.

An instance has been explained above in which the substrates 3 stored in the magazine 60A are moved up (are raised), but the substrates 3 can be moved down (lowered) in accordance with a reverse operation to the above-described operation.

In a magazine 60A such as the above-described one, a plurality (five) of substrates 3 can be stocked vertically over a plurality of tiers, as in the case of the magazine 60 of the above-described third embodiment. The magazine 60A has also a function of moving the substrates 3 in the vertical direction. Therefore, the magazine 60A can be used as the magazine of the buffer device illustrated in FIG. 8. The configuration of such a magazine 60A is not limited to the buffer device illustrated in FIG. 8, and the magazine 60A can also be used as the magazine of the loader illustrated in FIG. 6. Further, the magazine 60A can be used also as the magazine of the tray component supply devices 5a illustrated in FIG. 1, by having the flange sections Pa of the pallets P be supported on the guide grooves 731, 741 of the support members 72, 74.

The tray component supply devices 5a, the loader and the buffer device in which the storage device according to the present invention is used have been explained above, but are merely examples of preferred embodiments of the storage device according to the present invention, and the specific configuration of the storage device can accommodate various modifications without departing from the gist of the present invention.

The present invention explained above can be summarized as follows.

In order to solve the above problems, the present invention is a storage device storing plate-like members vertically over a plurality of tiers, this storage device including: a storage member having, in a vertical direction, a plurality of parallel storage sections that are capable of storing the plate-like members; and a first lifting and lowering mechanism that causes the plate-like members, stored in the storage member, to move integrally in the vertical direction, while the position of the storage member in the vertical direction is maintained.

In this storage device, only those plate-like members that are stored in the storage member can be moved in the vertical direction while there is maintained the vertical-direction position of the storage member itself in which the plate-like members are stored. By virtue of the storage device, therefore, it becomes possible to reduce significantly the driving force required for lifting and lowering, as well as the strength required from a mechanism portion, as compared with a conventional storage device in which both a storage member (stocker) and the plate-like members (pallets) that are stored therein are lifted and lowered.

In a more specific configuration, the storage member is a plurality of screw shafts that extend parallel to each other in the vertical direction, and the plate-like members are supported through insertion of end sections of the plate-like members into thread grooves that are at a same height position of the screw shafts and that serve as the storage sections; and the first lifting and lowering mechanism is provided with screw shaft support sections that rotationally support respective screw shafts about the axes thereof, and with a rotation driving mechanism that causes the screw shafts to rotate synchronously in a same direction, such that the plate-like members are moved in the vertical direction along the thread grooves as a result of rotational driving of the screw shafts.

In this configuration, the storage member in which the plate-like members are stored (supported) doubles as a member for supporting the plate-like members in order to move the plate-like members in the vertical direction. Moreover, it suffices to cause the screw shafts, as the storage member, to rotate about the axes thereof in order to move the plate-like members. Accordingly, the plate-like members can be moved integrally in the vertical direction, without accompanying any movement of the storage member in the vertical direction, by relying on a very simple configuration.

In another specific configuration, there is provided a pair of the storage members each having a plurality of shelves juxtaposed in the vertical direction opposing each other, such that both ends of the plate-like members are supported, from outside, by the shelves that are at a same height position and that serve as the storage sections; the first lifting and lowering mechanism includes: storage member support sections that support the pair of storage members in such a manner that the pair of storage members can come near, and move away from, an approach position at which the plate-like members can be supported and a separation position at which movement of the plate-like members in the vertical direction is allowed; a storage member driving mechanism that causes the pair of storage members to move to the approach position or the separation position; and a feed mechanism that collectively holds the plate-like members that are supported in the pair of storage members and that causes the plate-like members to move in the vertical direction, such that, in a state where the plate-like members are held by the feed mechanism, the pair of storage members is disposed at the separation position, and, in that state, the feed mechanism causes the plate-like members to move in the vertical direction, after which, the pair of storage members is returned to the approach position, and as a result the plate-like members are moved in the vertical direction.

In this configuration as well, the plate-like members can be moved integrally in the vertical direction, without accompanying any movement of the storage members in the vertical direction.

Preferably, there is further provided a plate-like member movement device that moves the plate-like members in a horizontal direction to perform at least one of storage and retrieval of the plate-like members to/from the storage members.

This configuration allows automating, in the storage device, at least one operation from among storage and retrieval of the plate-like members to/from the storage members.

In this case, preferably, there is further provided a second lifting and lowering mechanism that moves the plate-like member movement device along the storage members in the vertical direction.

This configuration allows efficiently storing and retrieving the plate like members without hindrance, both at a position where the plate-like members are stored into the storage members, and a position at which the plate-like members are retrieved from the storage members.

In the above storage device, the plate-like member movement device may perform operation of at least storage or retrieval of the plate-like members to/from a topmost storage section, from among the storage sections of the storage members, and when the plate-like members are stored by the plate-like member movement device, the first lifting and lowering mechanism, before that storage, moves integrally down the storage positions of the plate-like members that are stored in the storage sections, and when the plate-like members are retrieved by the plate-like member movement device, the first lifting and lowering mechanism, after retrieval, moves integrally up the storage positions of the plate-like members that are stored in the storage sections.

This configuration allows efficiently storing a plurality of plate-like members in the storage member, over a topmost storage section, and allows retrieving efficiently the plurality of plate-like members, stored in the storage member, over the topmost storage section.

In the above storage device, the plate-like member movement device may perform operation of at least storage or retrieval of the plate-like members to/from a lowermost storage section, from among the storage sections of the storage members, and when the plate-like members are stored by the plate-like member movement device, the first lifting and lowering mechanism, before that storage, moves integrally up the storage positions of the plate-like members that are stored in the storage sections, and when the plate-like members are retrieved by the plate-like member movement device, the first lifting and lowering mechanism, after retrieval, moves integrally down the storage positions of the plate-like members that are stored in the storage sections.

This configuration allows efficiently storing a plurality of plate-like members in the storage members, over a lowermost storage section, and allows retrieving efficiently the plurality of plate-like members, stored in the storage members, over the lowermost storage section.

This application is based on Japanese Patent application No. 2012-113460 filed in Japan Patent Office on May 17, 2012, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A component storage system, comprising:
   pallets for storing electronic components; and
   a storage device adapted to include and vertically store the pallets over a plurality of tiers in such a manner that each of the pallets can be loaded and unloaded to and from the storage device in a horizontal first direction,
   the storage device including:
      a storage unit having, in a vertical direction, a plurality of parallel storage sections, that are capable of storing the pallets; and
      a first lifting and lowering mechanism that causes the pallets, stored in the storage unit, to move integrally in the vertical direction, while the position of the storage unit in the vertical direction is maintained,
   wherein
   the storage unit is configured by a plurality of screw shafts that extend parallel to each other in the vertical direction, the screw shafts having thread grooves which serve as the storage sections;
   each of the pallets is provided with a dish-shaped section having a rectangular shape in a plan view and having a peripheral wall section, and has a pair of flange sections extending outward from respective opposite sides of the peripheral wall section in a second direction orthogonal to the first direction, and tilting and extending along inclined surfaces of the thread grooves so as to be supported by the inclined surfaces;
   the pallets are supported by the screw shafts through insertion of the flange sections of the pallets into the thread grooves; and
   the first lifting and lowering mechanism causes the screw shafts to rotate about axes thereof to thereby move the pallets in the vertical direction along the thread grooves.

2. The component storage system according to claim 1, wherein
   the storage unit supports the flange sections of the pallets in the thread grooves that are at a same height position of the plurality of screw shafts and that serve as the storage sections; and
   the first lifting and lowering mechanism is provided with screw shaft support sections that rotationally support respective screw shafts about the axes thereof, and with a rotation driving mechanism that causes the screw shafts to rotate synchronously in a same direction, such that the pallets are moved in the vertical direction along the thread grooves as a result of rotational driving of the screw shafts.

3. The component storage system according to claim 2, wherein
   the pallet has a rectangular shape in a plan view with a set of opposite sides parallel to the first direction, and
   the plurality of screw shafts support both corners of each of the opposite sides of the pallet.

4. The component storage system according to claim 1, further comprising:
   a pallet movement device that moves the pallet in a horizontal direction to perform at least one of storage and retrieval of the pallet to/from the storage unit.

5. The component storage system according to claim 4, further comprising:
   a second lifting and lowering mechanism that moves the pallet movement device along the storage unit in the vertical direction.

6. The component storage system according to claim 4, wherein the pallet movement device performs operation of at least storage or retrieval of the pallet to/from a topmost storage section, from among the storage sections of the storage unit, and when the pallet is stored by the pallet movement device, the first lifting and lowering mechanism, before that storage, moves integrally down storage positions of the pallets that are stored in the storage sections, and when the pallet is retrieved by the pallet movement device, the first lifting and lowering mechanism, after retrieval, moves integrally up the storage positions of the pallets that are stored in the storage sections.

7. The component storage system according to claim 4, wherein the pallet movement device performs operation of at least storage or retrieval of the pallet to/from a lowermost storage section, from among the storage sections of the storage unit, and when the pallet is stored by the pallet movement device, the first lifting and lowering mechanism, before that storage, moves integrally up storage positions of the pallets that are stored in the storage sections, and when the pallet is retrieved by the pallet movement device, the first lifting and lowering mechanism, after retrieval, moves integrally down the storage positions of the pallets that are stored in the storage sections.

8. The component storage system according to claim 4, wherein the pallet movement device comprises: a head that holds the pallet through suction of the pallet; and a movement device that causes the head to move in the first direction.

9. The component storage system according to claim 1, comprising:

a guide member that guides the pallets in the vertical direction while controlling displacement of the pallets in the horizontal direction caused by the rotation of the screw shafts.

10. A component mounting device comprising:

a component storage system as defined in claim 1;

a drawing mechanism that loads and unloads the pallet to and from the storage device; and a mounting head that holds components in a tray placed on a pallet that is drawn out from the component storage system by the drawing mechanism and mounts the components on a substrate.

\* \* \* \* \*